US010425089B2

(12) United States Patent
Kosonocky et al.

(10) Patent No.: US 10,425,089 B2
(45) Date of Patent: Sep. 24, 2019

(54) MASTER/SLAVE FREQUENCY LOCKED LOOP

(71) Applicants: Advanced Micro Devices, Inc., Santa Clara, CA (US); ATI Technologies ULC, Markham (CA)

(72) Inventors: Stephen V. Kosonocky, Ft. Collins, CO (US); Mikhail Rodionov, Richmond Hill (CA); Joyce C. Wong, Toronto (CA)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/850,593

(22) Filed: Dec. 21, 2017

(65) Prior Publication Data
US 2019/0199363 A1    Jun. 27, 2019

(51) Int. Cl.
| H03L 7/099 | (2006.01) |
| G06F 1/08 | (2006.01) |
| H03K 5/00 | (2006.01) |
| H03B 1/04 | (2006.01) |
| H03K 3/037 | (2006.01) |

(52) U.S. Cl.
CPC .............. *H03L 7/0992* (2013.01); *G06F 1/08* (2013.01); *H03B 1/04* (2013.01); *H03K 3/0372* (2013.01); *H03K 2005/00071* (2013.01)

(58) Field of Classification Search
None
See application file for complete search history.

(56) References Cited

U.S. PATENT DOCUMENTS

| 6,175,280 | B1 * | 1/2001 | Lloyd | H03J 1/0008 |
| | | | | 331/1 R |
| 6,922,111 | B2 | 7/2005 | Kurd et al. | |
| 7,173,495 | B1 | 2/2007 | Kenny et al. | |
| 8,604,852 | B1 * | 12/2013 | Turullols | H03L 7/07 |
| | | | | 327/159 |
| 9,954,540 | B1 * | 4/2018 | YangGong | H03L 7/07 |
| 2005/0184822 | A1 | 8/2005 | Mattila et al. | |

(Continued)

OTHER PUBLICATIONS

Kurd, N., et al., "Next Generation Intel® Core™ Micro-Architecture (Nehalem) Clocking," IEEE Journal of Solid-State Circuits, vol. 44, No. 4, Apr. 2009, pp. 1121-1129.

(Continued)

*Primary Examiner* — Cassandra F Cox
(74) *Attorney, Agent, or Firm* — Zagorin Cave LLP

(57) ABSTRACT

A master/slave configuration of a frequency locked Loop (FLL) decouples the process, target voltage, temperature (PVT) tracking goals of locking the loop from adapting the clock frequency in response to voltage droops in the supply. A master oscillator circuit receives a regulated supply voltage and supplies a master oscillator signal. A control circuit supplies a master frequency control signal to control a frequency of the master oscillator signal to a target frequency. A slave oscillator circuit is coupled to a regulated supply voltage and a droopy supply voltage and supplies a slave oscillator signal having a frequency responsive to a slave frequency control signal that is based on the master frequency control signal. The frequency of the second oscillator signal is further responsive to a voltage change of the droopy supply voltage.

20 Claims, 6 Drawing Sheets

(56) References Cited

U.S. PATENT DOCUMENTS

2008/0284530 A1* 11/2008 Pellerano ................ H03L 7/099
                                                                     331/1 A
2012/0086482 A1    4/2012  Maheshwari et al.
2013/0033331 A1    2/2013  Raghunathan et al.
2015/0162923 A1    6/2015  Jou et al.
2015/0270943 A1* 9/2015  Liu ....................... H04L 7/0276
                                                                  375/371

OTHER PUBLICATIONS

International Search Report in Application No. PCT/US2018/061736, dated Mar. 11, 2019, 10 pages.

* cited by examiner

MASTER/SLAVE FREQUENCY LOCKED LOOP

BACKGROUND

Description of the Related Art

Integrated circuits utilize clock signals to synchronize the flow of data through the integrated circuit. The data flow can be subject to strict timing requirements and the timing of the clock signals can vary with variations in the supply voltage. Noise affects power supplies in integrated circuits and can cause the voltage to vary above (overshoot) or below (droop) a nominal voltage level. Noise can adversely affect timing margins associated with the clock signals. Noise may be caused by deterministic noise sources and random noise sources. Present day high speed integrated circuits such as graphic processor units (GPUs) or central processing units (CPUs) compensate for noise on the power supply line by lowering the clock frequency in response to a voltage droop to allow more time for data signals to get from their source to their destination. Absent such adaptive clocking approaches that provide extra timing margin, failures can occur as a result of voltage droop.

Conventional adaptive clocking approaches utilize delay locked loops (DLLs) or frequency locked loops (FLLs) to lock frequency of the clock signal supplied to the integrated circuit components with the system clock being generated. That causes circuits in the adaptive clock system (using the DLL or FLL) to lock to an average noisy voltage and average clock frequency, causing uncertainty due to dependence on the power delivery response and application characteristics. In particular, the adaptive clock system can lock to low frequency noise that can be present due to temperature variations or low frequency voltage variations.

SUMMARY OF EMBODIMENTS OF THE INVENTION

Accordingly, embodiments herein utilize a master/slave configuration of a Frequency Locked Loop (FLL) to decouple the process, target voltage, temperature (PVT) tracking goals of locking the loop from adapting the clock frequency in response to voltage droops or overshoots in the supply voltage.

Accordingly, in one embodiment an apparatus includes a first oscillator circuit coupled to a first supply voltage and configured to supply a first oscillator signal. The first supply voltage is a regulated supply voltage. A control circuit is coupled to receive the first oscillator signal and to receive an indication of a target frequency and is configured to supply a first frequency control signal to control a frequency of the first oscillator signal to the target frequency. A second oscillator circuit is configured to supply a second oscillator signal having a frequency responsive to a second frequency control signal. The second frequency control signal is based on the first frequency control signal. The frequency of the second oscillator signal is further responsive to a voltage change of the second supply voltage.

In another embodiment, a method for compensating a clock signal in an integrated circuit includes supplying a first oscillator signal from a first oscillator circuit that receives a first supply voltage. The method further includes receiving an indication of a target frequency at a control circuit and generating a first frequency control signal to control a frequency of the first oscillator signal based on the target frequency and the frequency of the first oscillator signal. The method further includes supplying a second frequency control signal to a second oscillator circuit receiving the first supply voltage and receiving a second supply voltage. The second frequency control signal is based on the first control signal. The second oscillator circuit supplies a second oscillator signal with a frequency of the second oscillator signal based on the second frequency control signal. The second oscillator circuit also adjusts the frequency of the second oscillator signal responsive to a voltage change associated with the second supply voltage.

In another embodiment an apparatus includes a master oscillator circuit coupled to a regulated supply voltage. The master oscillator circuit is configured to supply a master oscillator signal. A control circuit is coupled to the master oscillator signal and is configured to supply a master frequency control signal to control a frequency of the master oscillator signal to a target frequency. A slave oscillator circuit is coupled to a regulated supply voltage and a droopy supply voltage and is configured to supply a slave oscillator signal having a frequency responsive to a slave frequency control signal that is based on the master frequency control signal. The frequency of the second oscillator signal is further responsive to a voltage change of the droopy supply voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
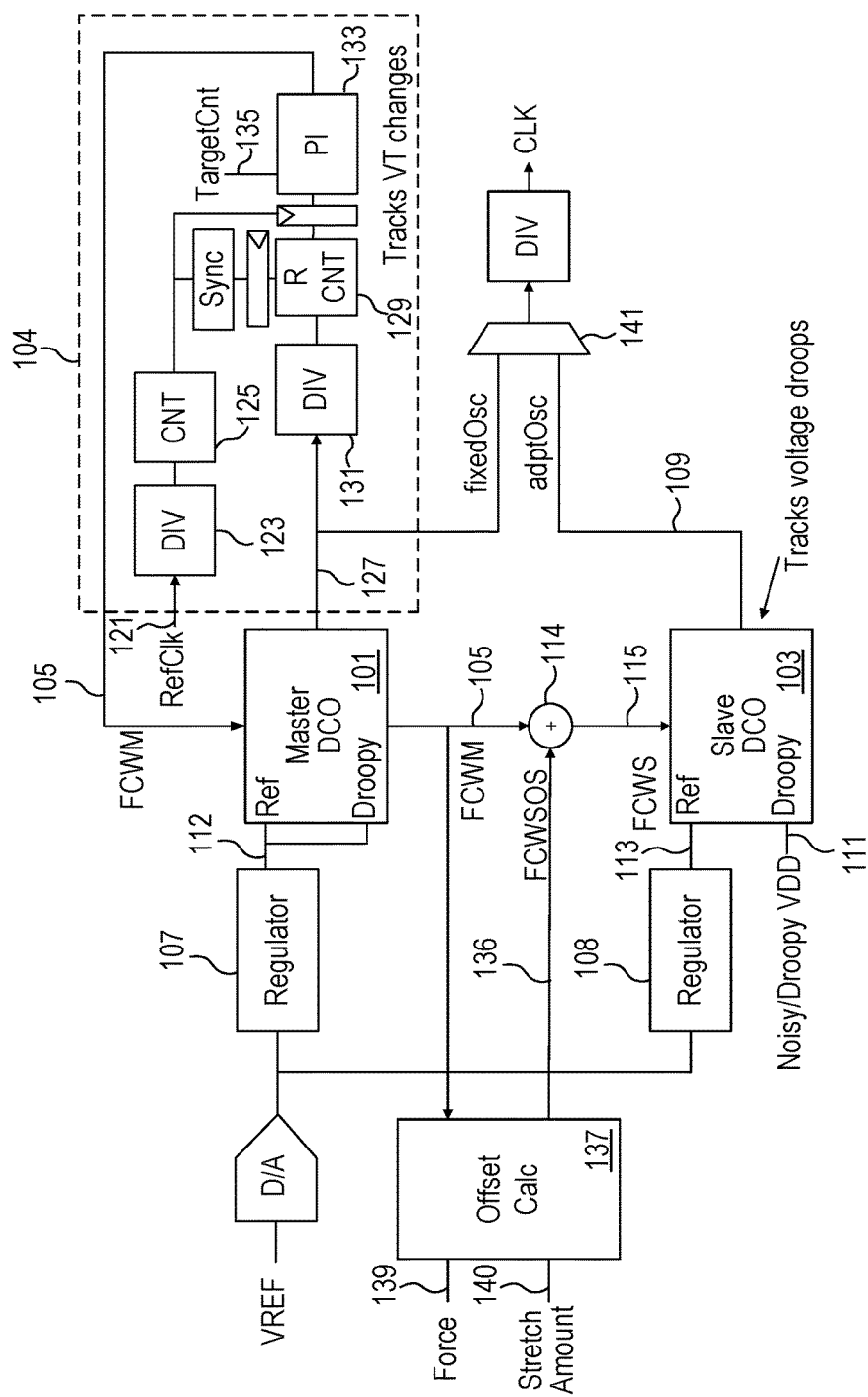
FIG. 1 illustrates an exemplary system including a master oscillator and a slave oscillator.

Referring to FIG. 1, an exemplary system includes a master oscillator 101 and a slave oscillator 103. In the illustrated embodiments, both the master and slave oscillators are digitally controlled oscillators (DCOs). A frequency-locked loop (FLL) that includes the master oscillator 101 and the loop control logic 104 tracks frequency changes caused by voltage and temperature changes associated with the master oscillator 101. The loop control logic 104 supplies the master oscillator with a frequency control word (FCWM) 105. The master oscillator 101 receives a regulated voltage 112 from regulator 107. That ensures that the voltage received by the master DCO 101 is much "cleaner" than the noisy or droopy VDD voltage 111 received by the slave oscillator 103. The droopy voltage may be, e.g., the voltage utilized by a processor core. The slave oscillator 103 utilizes the maser oscillator control signal to control frequency and also adapts the slave oscillator output 109 to variations in the droopy voltage 111 as explained further herein.

The slave oscillator 103 receives a slave frequency control word (FCWS) 115 based on the master frequency control word FCWM from the summing circuit 114. That allows an offset to be added to the FCWM to create the slave frequency control word FCWS 115. The offset can have a value of zero in which case the slave oscillator receives the FCWM unchanged. In embodiments, the slave and master oscillators are located in close physical proximity so PVT variations that affect the master oscillator also affect the slave oscillator. While the master and slave oscillators may be digitally controlled oscillators as shown in the embodiment of FIG. 1, in other embodiments the oscillators may be voltage or current controlled oscillators. The control signal FCWM and FCWS may be multi-bit digital signals to control the frequency of the DCOs. In other embodiments the FCWM and FCWS are voltage or current signals for analog control of the oscillators. In analog embodiments the summer circuit 114 is implemented to add or subtract voltages or currents.

Loop control logic 104 receives a reference clock 121 having a known frequency. In the illustrated embodiment the reference clock may be divided down in divider 123. A counter 125 counts a predetermined number of reference clock periods to provide a sampling window for the master oscillator clock signal 127. Counter 129 counts the master oscillator clock signal (or a divided down version) during the sampling window. In the illustrated embodiment, a divider 131 divides the master oscillator clock signal 127. A proportional and integral (PI) controller 133 receives the count of the number of divided down master oscillator clock signal periods over the sampling window and compares the sampled count value to a target count value 135. The target count value represents the target frequency for the master oscillator clock signal 127. While the illustrated embodiment utilizes a PI controller 133, other control approaches may be utilized in other embodiments. The control logic 104 may be implemented in a microcontroller or other control logic. The control loop tracks low frequency changes resulting from changes in voltage and temperature and also compensates for process variations associated with the particular die, which allows the slave oscillator 103 to be isolated from low frequency PVT variations and respond to the higher frequency voltage droops or overshoots that occur in the noisy voltage supplied to a voltage domain of an integrated circuit.

While FIG. 1 shows separate regulator blocks 107 and 108, embodiments may utilize a single regulator to supply the regulated voltage to the master and slave oscillators 101 and 103 in which case the regulated voltages 112 and 113 are the same voltage. A selector circuit 141 receives the master oscillator output signal 127 and the slave oscillator output signal 109. The selector circuit may select the master oscillator signal to be output from selector circuit 141 for test purposes. If the adaptive clock generator is on a voltage supply that is shut off and the clock is still needed by other logic, the clock signal from the master oscillator can be selected operationally.

Figure 2:
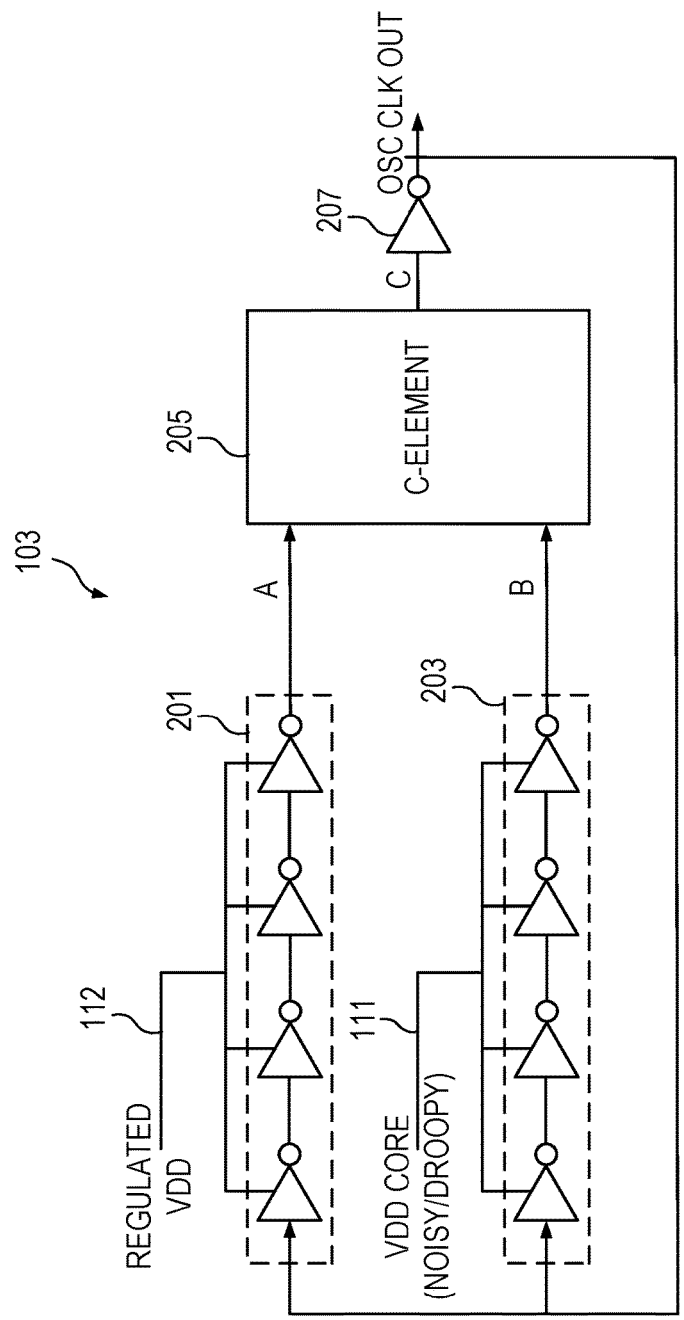
FIG. 2 illustrates a high level block diagram of an embodiment of a slave oscillator.

FIG. 2 illustrates a high level block diagram of an exemplary slave oscillator 103 that functions as an adaptive oscillator to slow down system clocks in response to a voltage droop and to limit the frequency response to voltage overshoots. The adaptive slave oscillator 103 includes a reference delay line 201 that operates with the regulated voltage VDD 113 and a droopy delay line 203 that operates with the noisy/droopy voltage 111. The voltage supplied to delay line 201 is "clean" and the clock signal A should be more stable than clock signal B. The delay line 203 outputs a clock signal B that varies in frequency with the droopy voltage. When the droopy voltage 111 droops, the delay line slows down and when the droopy voltage increases, the delay line speeds up. Note that the inverter 207 forms the fifth inverter to ensure each of the delay lines 201 and 203 functions as an oscillator.

Figure 3:
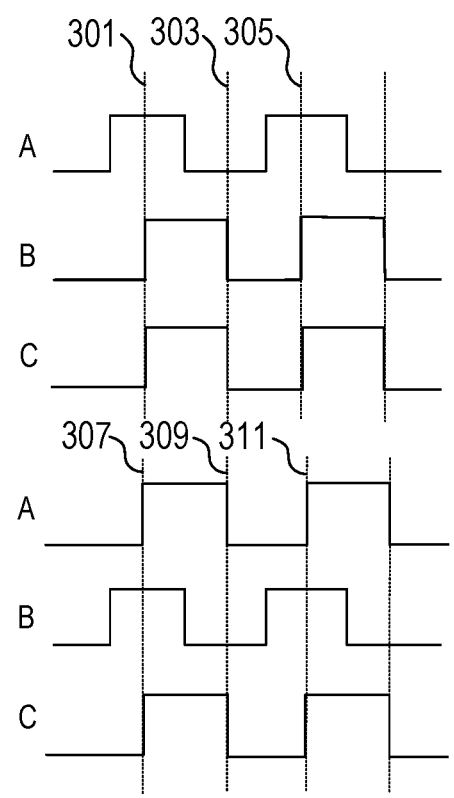
FIG. 3 illustrates a timing diagram illustrating operation of the C-element of the slave oscillator.

As shown in FIG. 3, the C-element logic 205 outputs an output signal C with a logic high when both inputs A and B are high at 301. The C-element logic 205 keeps the output signal C high until both inputs A and B are low at 303. Once the output C is a logic low, the C-element maintains the output C low until both inputs again become high at 305. As shown in FIG. 3 when clock signal A leads clock signal B, clock signal C is the same as clock signal B. When clock signal B leads clock signal A, clock signal C is the same as clock signal A. Thus, the C-element logic 205 outputs a logic high output signal C when both inputs A and B are high at 307 and keeps the output C high until both inputs become low at 309. Once the output C is a logic low, the C-element maintains the output C low until both inputs again become high at 311. In other words, the logic 205 selects the latest pulse to output.

Figure 4:
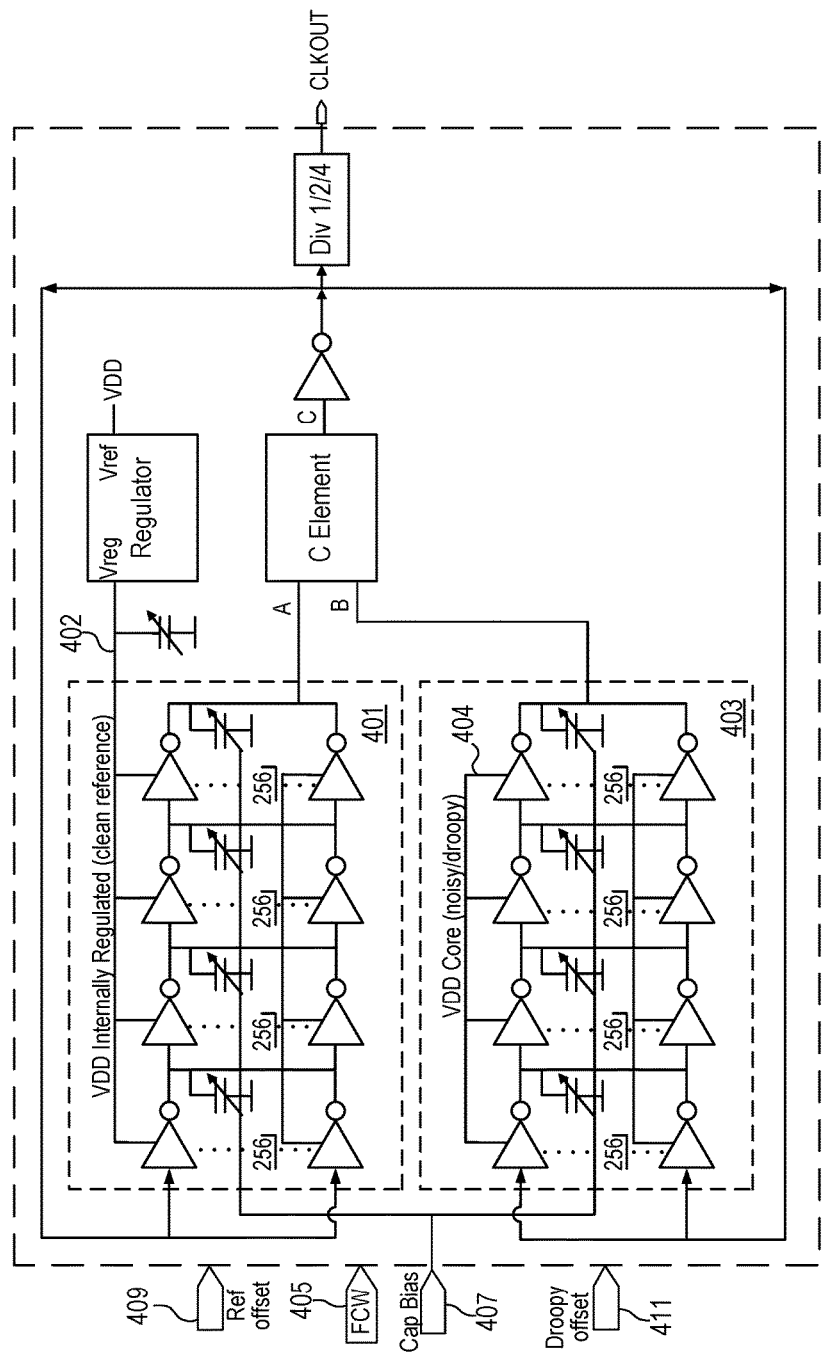
FIG. 4 illustrates a high level block diagram showing additional details of an embodiment of a slave oscillator.

FIG. 4 shows a more detailed view of an embodiment of the adaptive slave oscillator 103. The embodiment includes a reference delay line 401 that receives a regulated voltage 402 and a droopy delay line 403 that receives a droopy voltage 404. Each of the delay lines has a number of rows of delay elements that can be turned on or off. The more rows that are turned on, the faster the delay element operates. In an embodiment the delay lines 401 and 403 have 256 rows. Other embodiments can have other numbers of rows. Embodiments may use tristate inverters shown in FIG. 4, buffers, or other forms of delay elements. In addition, while single-ended embodiments are illustrated, other embodiments may utilize differential delay lines.

A frequency control word (FCW) 405 selects how many rows in each of the delay lines are enabled and therefore the output frequency of each of the delay lines. In the illustrated embodiment a bias setting 407 controls the variable capacitors in each of the delay lines. In addition, an offset value 409 can be used to adjust the FCW 405 supplied to the reference delay line 401 if desired. The droopy delay line 403 receives an offset value 411 that can be used to adjust the FCW 405 supplied to the droopy delay line 403. The offset logic for the reference delay line and the droopy delay line is not shown for ease of illustration. The embodiment illustrated in FIG. 4 effectively deals with high frequency noise such as voltage droop but does not work well for low frequency noise. In fact, the circuit of FIG. 4 may lock onto low frequency noise and fail to compensate for the noise. Utilizing the master oscillator control loop (see FIG. 1) more effectively compensates for low frequency noise in the system.

In an embodiment, the master oscillator 101 (FIG. 1) includes two delay lines such as shown in FIG. 4. However, rather than one of the delay lines receiving a regulated voltage supply and one of the delay lines receiving a droopy voltage supply, each of the delay lines receives the regulated voltage supply. Thus, in such an embodiment, the C-element output reflects both the delay lines of the master oscillator.

Referring back to FIG. 1 the summer circuit 114 forms the slave control word FCWS 115 from the master frequency control word FCWM and an offset value 136 generated in offset calculation logic 137. The offset calculation logic receives inputs 139 and 140 that cause the offset calculation logic to increase or decrease the offset value 136 supplied to summer circuit 114 to thereby increase or decrease the FCWM 105 before it is supplied to the slave oscillator 103. The offset value 136 may be zero in which case the slave oscillator uses the master frequency control word 105 without alteration. In certain situations, e.g., a detected current excursion, e.g., a current overshoot or undershoot, offset calculation logic 137 receives a force signal 139 to adjust the frequency supplied by the slave oscillator by adding or subtracting an offset from the master frequency control word depending on the direction of the current excursion. Other situations may result in a nonzero offset. For example, two independent clock domains may be operating in the integrated circuit and the domain supplied by the slave DCO 103 may need to slow down in order to avoid overrunning a FIFO in the other clock domain. In addition, the offset may be used to effect various power management outcomes to speed up or reduce the clock frequency supplied by the slave oscillator. In the illustrated embodiment, the offset calculation logic 137 receives the master frequency control word 105 in order to help determine an appropriate offset amount. While shown separately, the summer 114 and offset calculation logic 137 may be combined and supply the modified FCWM as the FCWS. In an embodiment, the slave oscillator 103 has two offset calculation blocks 137 (only one shown) and two summing circuits 114 (only one shown). One of the offset calculation blocks and summing circuit is for the reference delay line (e.g., 201, 401 in FIGS. 2 and 4) and the other offset calculation block and summing circuit is for the droopy delay line (see, e.g., 203, 403 in FIGS. 2 and 4). That allows for independent adjustment of the frequency of the slave reference and droopy delay lines that are otherwise controlled by the master frequency control word.

Figure 5:
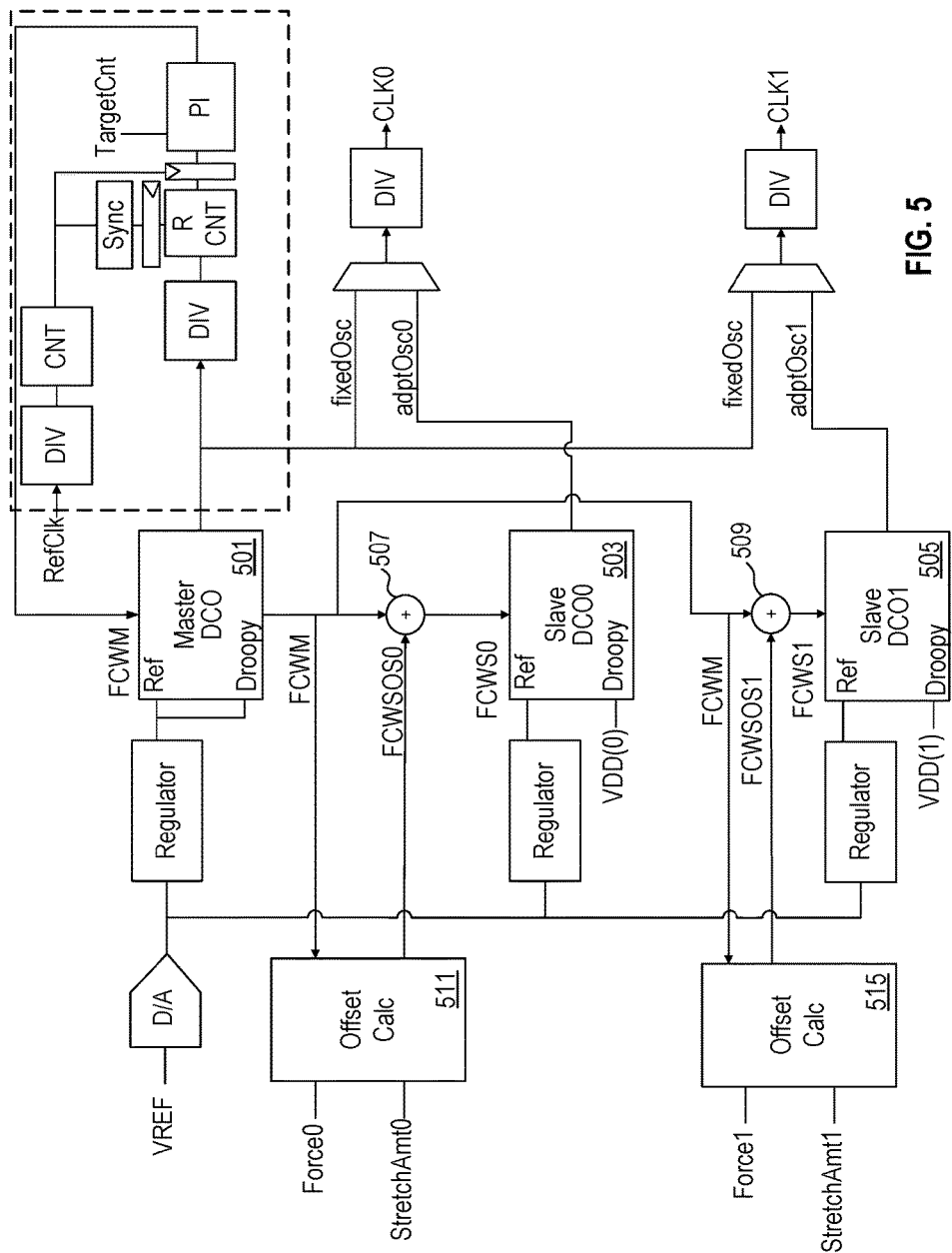
FIG. 5 illustrates a high level block diagram of an embodiment in which a master oscillator controls multiple slave oscillators.

FIG. 5 illustrates an embodiment in which master oscillator 501 controls two slave oscillators 503 and 505. Slave oscillator 503 receives the master frequency control word (FCWM) through a summer circuit 507 and slave oscillator 505 receives the master frequency control word (FCWM) through a summer circuit 509. Slave oscillator 503 receives droopy voltage VDD(0) and slave oscillator 505 receives droopy voltage VDD(1). VDD(0) and VDD(1) can be derived from a common input voltage rail but utilized in separately controlled voltage and clock domains. For example, one voltage domain may be turned off while the other voltage domain remains powered. The two slave oscillators may receive different reference voltages. Separate offset calculation blocks 511 and 515 independently determine any required offsets for the two slave oscillators frequency control words FCWS0 and FCWS1.

Figure 6:
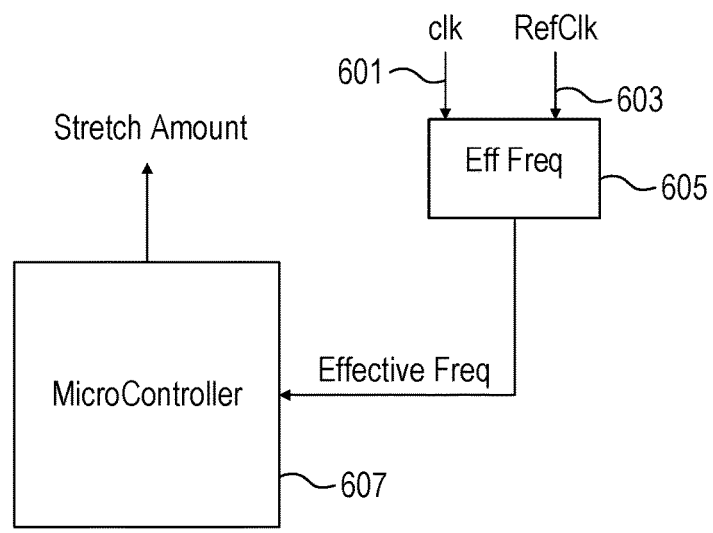
FIG. 6 illustrates an embodiment of a control structure to generate offsets for the slave oscillator.
Figure 7:
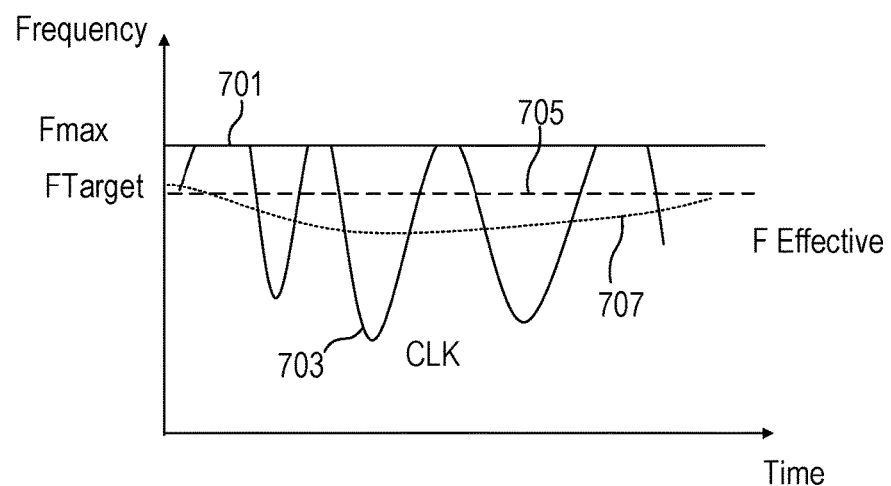
FIG. 7 illustrates how the effective frequency can be tracked and adjusted by a control loop to be closer to a target frequency.

FIGS. 6 and 7 provide an example of how the Stretch Amount may be determined and supplied to the offset calculation logic 137 (FIG. 1). In addition to the control loop 104, the clock logic may include logic to determine an effective frequency of the slave oscillator over a predetermined time period. The slave oscillator output signal 601 and a known reference clock signal 603 are supplied to an effective frequency calculation logic 605. The effective frequency calculation logic counts the number of slave oscillator clock cycles that occur over a predetermined number of reference clock cycles in order to determine an effective frequency. The number of reference clock cycles corresponds to a particular time period, e.g., 10 ms. The microcontroller 607 may operate a proportional integral derivative (PID), a PI control loop, or another form of control to control the effective frequency.

Referring to FIG. 7, the control logic sets a maximum frequency Fmax 701. Curve 703 represents the actual frequency. As can be seen the actual frequency is limited by the maximum frequency. The controller may ensure that the frequency is limited to the maximum frequency using the stretch amount input 140 to the offset calculation logic 137 to limit the frequency (see FIG. 1) by reducing the frequency control word and slowing down the slave oscillator. The target frequency is shown as 705. If over time the effective frequency 707 is too far below the target frequency 705, the stretch amount input 140 can be used to increase the frequency of the slave oscillator and over time increase the effective frequency to be closer to the target frequency as shown in FIG. 7. When the effective frequency is above the target frequency, the effective frequency can be reduced using the offset calculation logic to adjust the master frequency control word to reduce the slave oscillator frequency. In addition to controlling frequency through the offset applied to the master frequency control word, the controller can also increase or decrease VDD in response to the effective frequency being above or below a target value.

While circuits and physical structures are generally presumed for some embodiments, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. Embodiments are contemplated to include circuits, systems of circuits, related methods, and non-transitory computer-readable medium encodings of such circuits, systems, and methods, all as described herein, and as defined in the appended claims. As used herein, a non-transitory computer-readable medium includes at least disk, tape, or other magnetic, optical, semiconductor (e.g., flash memory cards, ROM), or electronic medium.

Thus, embodiments have been described that decouple the tracking goals for target voltage and temperature from adapting the clock frequency in response to high frequency voltage variations in the supply voltage. The description set forth herein is illustrative, and is not intended to limit the scope of the following claims. Other variations and modifications of the embodiments disclosed herein, may be made based on the description set forth herein, without departing from the scope set forth in the following claims.

What is claimed is:
1. An apparatus comprising:
   a first oscillator circuit coupled to a first supply voltage and configured to supply a first oscillator signal, the first supply voltage being a regulated supply voltage;
   a control circuit coupled to the first oscillator signal and coupled to an indication of a target frequency and configured to supply a first frequency control signal to control a frequency of the first oscillator signal to the target frequency;
   a second oscillator circuit configured to supply a second oscillator signal having a frequency responsive to a second frequency control signal, the second frequency control signal being based on the first frequency control signal and wherein the frequency of the second oscillator signal is further responsive to a voltage change of a second supply voltage; and
   a circuit to combine the first frequency control signal and an offset to generate the second frequency control signal.

2. The apparatus as recited in claim 1, wherein the second oscillator circuit further comprises:
a first delay line coupled to the first supply voltage or another regulated supply voltage and coupled to the second frequency control signal, wherein the first delay line supplies a first delay line output signal;
a second delay line coupled to the second supply voltage and coupled to the second frequency control signal, wherein the second delay line supplies a second delay line output signal; and
a logic circuit to supply the second oscillator signal according to a logical relationship of the first delay line output signal and the second delay line output signal.

3. The apparatus as recited in claim 2, wherein the first oscillator circuit further comprises:
a third delay line coupled to the regulated supply voltage and coupled to the first frequency control signal, wherein the third delay line supplies a third delay line output signal;
a fourth delay line coupled to the regulated supply voltage and coupled to the first frequency control signal, wherein the fourth delay line supplies a fourth delay line output signal; and
a second logic circuit to supply the first oscillator signal according to a logical relationship of the third delay line output signal and the fourth delay line output signal.

4. The apparatus as recited in claim 1, wherein the first frequency control signal is a first digital signal and the offset is a second digital signal and the circuit is a summing circuit to add or subtract the second digital signal to or from the first digital signal.

5. The apparatus as recited in claim 1, wherein the first oscillator circuit tracks variations in temperature and voltage variations in the regulated supply voltage.

6. The apparatus as recited in claim 1, further comprising a selector circuit to select between the first oscillator signal and the second oscillator signal.

7. The apparatus as recited in claim 1, further comprising:
a third oscillator circuit coupled to a third supply voltage and coupled to a third frequency control signal and configured to supply a third oscillator signal having a third frequency responsive to variations of the third supply voltage; and
wherein the frequency of the third oscillator signal is further responsive to the third frequency control signal, the third frequency control signal being based on the first frequency control signal.

8. The apparatus as recited in claim 7, further comprising:
a second circuit to combine the first frequency control signal and an offset and supply the third frequency control signal.

9. A method for compensating a clock signal in an integrated circuit comprising:
supplying a first oscillator signal from a first oscillator circuit receiving a first supply voltage;
receiving an indication of a target frequency at a control circuit;
generating a first frequency control signal to control a frequency of the first oscillator signal based on the target frequency and the frequency of the first oscillator signal;
supplying a second frequency control signal to a second oscillator circuit receiving the first supply voltage and receiving a second supply voltage, the second frequency control signal based on the first frequency control signal;

supplying a second oscillator signal from the second oscillator circuit with a frequency of the second oscillator signal based, at least in part, on the second frequency control signal; and
adjusting the frequency of the second oscillator signal responsive to a voltage change associated with the second supply voltage.

10. The method as recited in claim 9, further comprising:
supplying the second frequency control signal and the first supply voltage to a first delay line of the second oscillator circuit;
supplying a first delay line output signal from the first delay line;
supplying the second frequency control signal and the second supply voltage to a second delay line of the second oscillator circuit;
supplying a second delay line output signal from the second delay line;
supplying the first delay line output signal and the second delay line output signal to logic circuit; and
supplying the second oscillator signal from the logic circuit according to a logical relationship of the first delay line output signal and the second delay line output signal.

11. The method as recited in claim 9, wherein the first supply voltage is a regulated supply voltage and wherein the second supply voltage is a droopy supply voltage.

12. The method as recited in claim 9, further comprising:
combining the first frequency control signal and an offset signal to generate the second frequency control signal.

13. The method recited in claim 9, further comprising the second oscillator circuit tracking variations in voltage of the second supply voltage to generate the second oscillator signal.

14. The method recited in claim 9, further comprising the first oscillator circuit tracking variations in temperature and variations in voltage of the first supply voltage.

15. The method recited in claim 9, further comprising selecting in a selector circuit one of the first oscillator signal and the second oscillator signal.

16. The method recited in claim 9, further comprising:
supplying a third supply voltage and the first supply voltage to a third oscillator circuit;
supplying a third frequency control signal to the third oscillator circuit to control, at least in part, a frequency of a third oscillator signal; and
adjusting the frequency of the third oscillator signal responsive to variations of the third supply voltage.

17. The method recited in claim 16, further comprising:
combining the first frequency control signal and a second offset signal to generate the third frequency control signal.

18. An apparatus comprising:
a master oscillator circuit coupled to a regulated supply voltage and configured to supply a master oscillator signal;
a control circuit coupled to the master oscillator signal configured to supply a master frequency control signal to control a frequency of the master oscillator signal to a target frequency; and
a slave oscillator circuit coupled to a second regulated supply voltage and a droopy supply voltage and configured to supply a slave oscillator signal having a frequency responsive to a slave frequency control signal based on the master frequency control signal and wherein the frequency of the slave oscillator signal is further responsive to a voltage change of the droopy supply voltage.

19. The apparatus as recited in claim 18, further comprising:
an arithmetic circuit to modify the master frequency control signal according to an offset signal and supply the slave frequency control signal.

20. The apparatus as recited in claim 18 where the regulated supply voltage and the second regulated supply voltage are the same voltage.

\* \* \* \* \*